United States Patent [19]

Peppel

[11] Patent Number: 4,698,520
[45] Date of Patent: Oct. 6, 1987

[54] METHOD AND APPARATUS TO TRIGGER THE CURRENT-CONDUCTING STATE OF GATE-TURN-OFF THYRISTOR

[75] Inventor: Joerg-Michael Peppel, Koenigstein, Fed. Rep. of Germany

[73] Assignee: Siemens Aktiengesellschaft, Berlin and Munich, Fed. Rep. of Germany

[21] Appl. No.: 702,036

[22] Filed: Feb. 15, 1985

[30] Foreign Application Priority Data

Feb. 17, 1984 [DE] Fed. Rep. of Germany ....... 3405769

[51] Int. Cl.$^4$ ............................................ H03K 17/72
[52] U.S. Cl. ................................... 307/633; 307/268; 307/305; 307/639; 323/239; 323/246
[58] Field of Search ............ 307/252 C, 252 H, 252 J, 307/252 N, 252 W, 305, 268; 323/239, 246; 363/57

[56] References Cited

U.S. PATENT DOCUMENTS 3,728,557 4/1973 Pelly et al. ................... 307/252 UA
3,821,630 6/1974 Kornrumpf et al. ................... 363/57
4,417,156 11/1983 Fukui et al. ...................... 307/252 C
4,456,836 6/1984 Matsuda et al. ................. 307/252 C

FOREIGN PATENT DOCUMENTS 0064450 11/1982 European Pat. Off. .
0068558 6/1978 Japan ..................................... 363/57

OTHER PUBLICATIONS

8095 IEEE Transactions on Industry Applications vol. IA-19 (1983) May–Jun., No. 3, Part 1, New York, USA, "Development of PWM Inverter Employing GTO'"—Matsuda et al.

Primary Examiner—John Zazworsky
Attorney, Agent, or Firm—Volker R. Ulbrich

[57] ABSTRACT

A method and apparatus to maintain the current-conducting state of a gate-turn-off thyristor by appropriate triggering. To maintain the thyristor's current-conducting state reliably and with little ignition energy consumed, a comparator signal is generated as soon as the voltage drop across the thyristor exceeds a preset limit value by a comparator stage. The comparator signal has a preset duration defined by a pulse duration limiting stage, and, if necessary, a subsequent pulse magnitude limiting stage can change the pulse magnitude as a function of the interval between two subsequent ignition current pulses. A controllable current source connected to the thyristor gate is controlled by these magnitude and duration limited pulses, but this controlled current source only triggers the thyristor when the limit value is exceeded.

7 Claims, 11 Drawing Figures

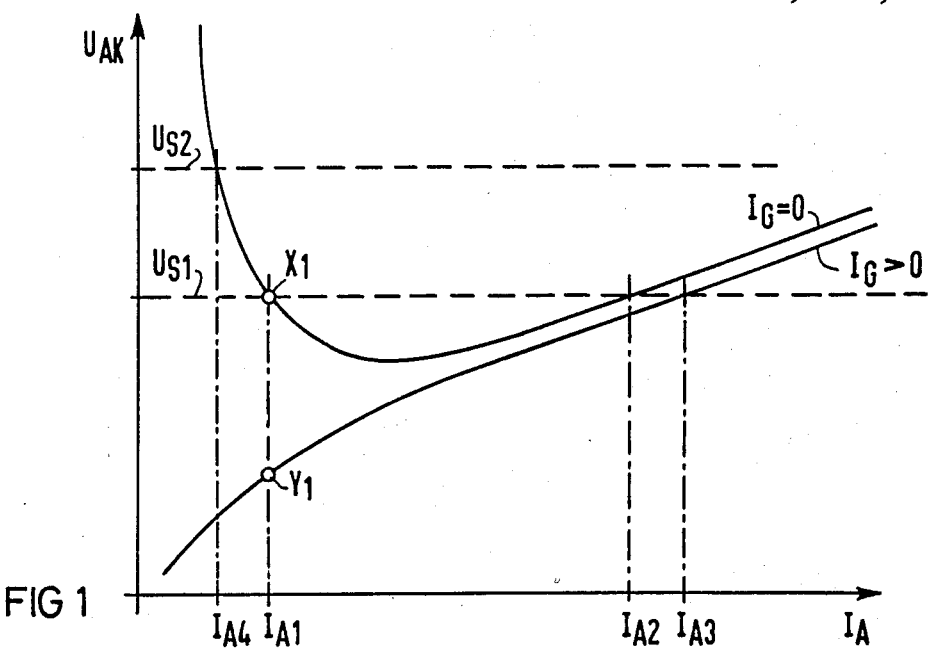
FIG 1
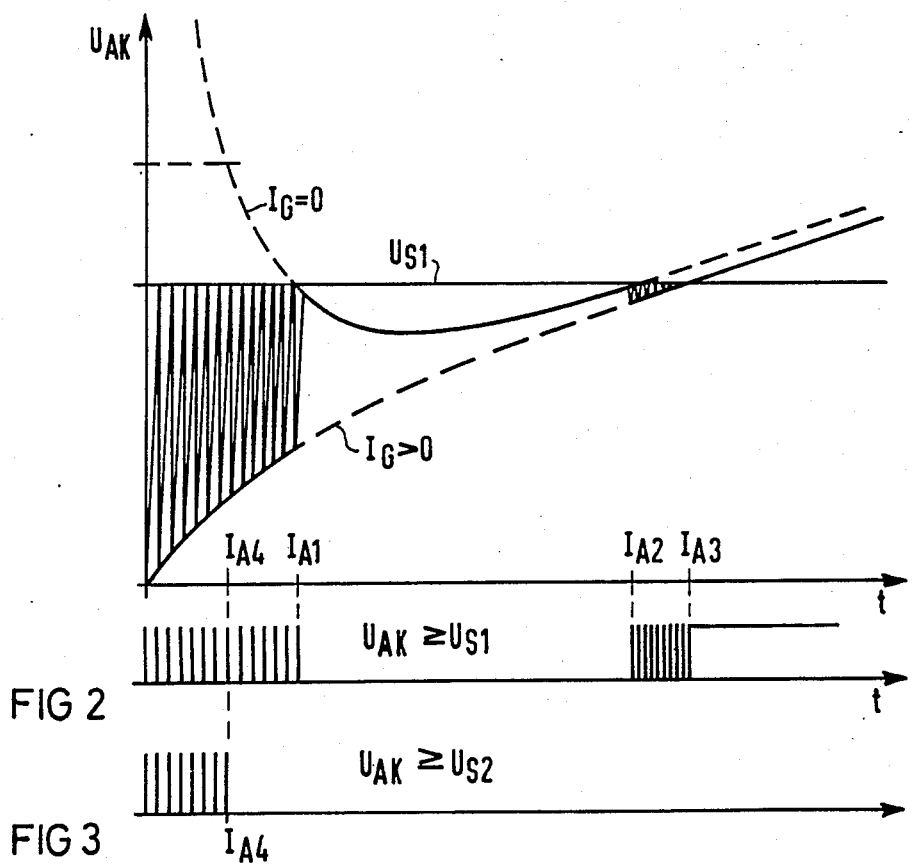
FIG 2
FIG 3

METHOD AND APPARATUS TO TRIGGER THE CURRENT-CONDUCTING STATE OF GATE-TURN-OFF THYRISTOR

BACKGROUND OF THE INVENTION

This invention relates to a method to trigger the power-conducting state of a gate-turn-off, GTO, thyristor. The invention also relates to an apparatus to perform this method.

Thyristors which can be turned off by a suitable control current connected to their gate terminals permit a significantly simpler design of converters, direct d.c. converters and other equipment used in power electronics than traditional thyristors, which can only be switched on by an ignition current and thereafter retain their power-conducting state until the anode-to-cathode current flow reverts to zero, either by natural means or by the introduction of a counter-voltage so that they are extinguished automatically.

The conducting state of a GTO thyristor is thus initiated by a positive ignition current pulse on the gate. There is a danger in using a GTO thyristor due to the internal structure particularly in case of a low load condition (a low current between anode and cathode). The thyristors partially extinguish, i.e., in one portion of their current-conducting cross-section, and even with a renewed increase in current do not revert to their full conducting state. Such an incomplete conducting state can lead to a breakdown of the GTO. It could even lead to the situation that the thyristor extinguishes at a low current level so that a current block results despite a desired conducting state. It is thus necessary, even after an initial ignition pulse with a GTO thyristor, to trigger this thyristor using an ignition current in accordance with the current-conducting state to avoid any partial or total extinction in case of a low current load.

For that purpose either a constant control current or a preset sequence of ignition current pulses could be transmitted through the GTO during the entire current-conducting period. This, however, would involve very high energy requirements which during the switching cycle could often represent the greatest portion of the total control energy.

The object of this invention is to ensure a reliable current-conducting state of said GTO. A second object of this invention is to provide said current-conducting state using reduced control power into the thyristor gate circuit.

SUMMARY OF THE INVENTION

Briefly stated in accordance with one aspect of the invention, the foregoing objects are achieved by providing a method and an apparatus for triggering the current-conducting state of a gate-turn-off thyristor having a comparator stage which issues a comparator output signal whenever the voltage drop across the thyristor goes above a preset limit. The comparator output signal, when issued, goes into the pulse duration limiting stage and generates a preset duration ignition command therein. The ignition command generated in the pulse duration limiting stage goes into a controlled current source and generates therein an ignition current pulse to the thyristor gate to trigger current-conductance.

BRIEF DESCRIPTION OF THE DRAWINGS

While the specification concludes with claims particularly pointing out and distinctly claiming the subject matter which is regarded as the invention, it is believed that the invention will be better understood from the following description of the preferred embodiment taken in conjunction with the accompanying drawings in which:

FIG. 1 is a thyristor characteristic curves for $I_G=0$ and $I_G>0$.

FIG. 2 is a plot of the thyristor anode to cathode voltage and gate current in a dynamic case where anode current increases with a constant threshold voltage and constant gate trigger pulses.

FIG. 3 is the gate current plot for the case of FIG. 2 only with a high threshold.

DESCRIPTION OF A PREFERRED EMBODIMENT

Figure 4:
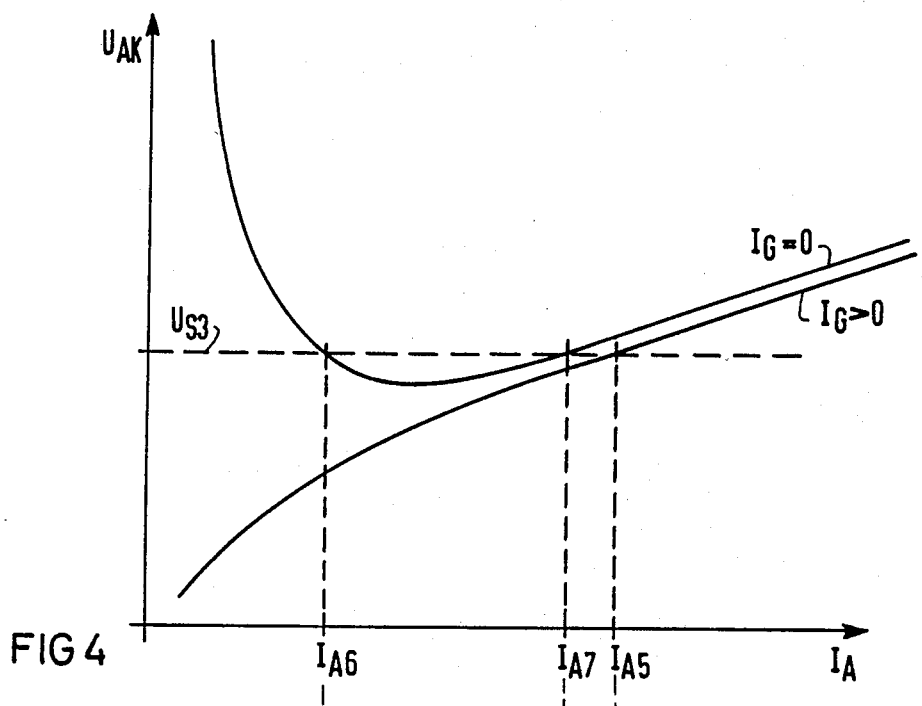
FIG. 4 is a plot similar to FIG. 2 only with the gate trigger pulses controlled according to the invention.

FIG. 1 shows the characteristic functions for the anode-cathode voltage $U_{AK}$ of the thyristor as a function of the current load $I_A$ flowing from anode to cathode, with the function specified by $I_G=0$ indicating the pattern of voltage $U_{AK}$ during its current-conducting state in the event that the gate does not receive any ignition current $I_G$ over an extended period. $I_G>0$ indicates the corresponding voltage pattern when connecting an adequate continuous ignition current.

From these figures it can be seen that the voltage drop $U_{AK}$ at the thyristor decreases proportionately to the load current $I_A$ as the load currents decrease and, in case of a low current load, drops to zero at a more than proportional rate when an ignition current, $I_G>0$, is connected. If, however, no ignition current is supplied, then, as the current load $I_A$ drops further, a result of a partial extinction of the thyristor, there is a steep increase in the voltage drop $U_{AK}$, which eventually increases to the total voltage connected to the thyristor. The thyristor then assumes a locked state.

The basic principle underlying this invention is that it is not necessary to provide a constant pulse during the entire current-conducting period, but that it rather suffices to provide a pulse whenever the voltage drop has attained a preset threshold value, e.g., $U_{S1}$. At a current load $I_{A1}$ the voltage $U_{AK}$ can rise without ignition current up to a point $X_1$ on the characteristic function $I_G=0$. At $U_{AK}=U_{S1}$ the voltage drop, due to a positive control current $I_g$, drops down to a value $Y_1$ on the characteristic function $I_G>0$, while at the same time the already extinguished areas of the thyristor cross-section are reignited. If, when falling below the limit value $U_{S1}$, the ignition current is removed, then the voltage rises again until a new ignition pulse appears when the threshold value $U_{S1}$ is attained. Thus, in the event of a low current load, a sequence of pulses arises instead of a constant current. For $I_A < I_{A1}$ the voltage thus no longer rises to the stationary characteristic function $I_G = 0$; rather, the ignition pulse is issued already at $U_{AK} = U_{S1}$, and a sequence of sequential ignition current pulses arises.

FIG. 2 shows this pulse sequence for a situation in which the load current is continuously increased. For low load currents, conditions without ignition current, wherein the voltage drops below the threshold value $U_{S1}$, alternate with conditions in which the threshold value is exceeded and the ignition current switched on. The impulse sequence shown in FIG. 2 thus describes the oscillation of the thyristor voltage $U_{AK}$ between the upper limit value $U_{S1}$ and a lower limit value indicated by the characteristic function $I_G > 0$. If the load current $I_A$ exceeds the value $I_{A1}$ at which the upper characteristic function intersects the function defined by $U_{S1}$, then the thyristor voltage will not increase to the threshold value $U_{S1}$ even without ignition current; thus, there will be no further ignition. Only for load currents above $I_{A2}$ can the thyristor voltage return to the threshold value $U_{S1}$ so that for this high-load condition there would again be ignition current pulses in accordance with a thyristor voltage oscillating between $U_{S1}$ and the lower characteristic function. Finally at the value $I_{A3}$ the thyristor voltage exceeds the threshold value $U_{S1}$ even given the presence of the ignition current $I_G > 0$; thus, a constant pulse is generated for $I_A > I_{A3}$.

In contrast to controlling using constant ignition current, this method brings about no control losses in the range $I_{A1} < I_A < I_{A2}$ of FIG. 2 due to the elimination of the control pulses. The constant pulse at $I_A < I_{A3}$ shown in FIG. 2 conversely brings about an unnecessary consumption of control energy, since basically no partial extinction of the GTO is to be feared in this load range. These losses could be reduced by having the threshold value, corresponding to the value $U_{S2}$, similarly shown in FIG. 1, be a higher value so that instead of the pattern shown in FIG. 2, when continously increasing the current load, one would now have a pulse sequence as shown in FIG. 3. However, increasing the threshold value has the effect that now the point of intersection $I_{A4}$ defined by $U_{AK} = U_{S2}$ would fall in a range characterized by very incompletely conducting conditions, associated with undesirably high GTO on-state voltages and the already mentioned danger of thyristor breakdown. Operating with a high threshold value $U_{S2}$ is thus generally not reliable and therefore unacceptable.

In addition, the ignition current always has to be measured in accordance with the ignition requirements, while basically to maintain the conducting state using a continuous ignition current, only a low current is required. Thus, on the one hand, at $I_A > I_{A3}$ when proceeding according to FIGS. 1 and 2, higher current losses arise than with constant ignition currents, and even in the range $I_A < I_{A1}$ the ignition current pulses do not offer optimal energy conserving characteristics in contrast to the constant current.

Furthermore, in this method the extent of a current pulse is determined by the reaction time of a limit switch for $U_{AK}$ greater than or equal to $U_{S1}$. If, however, the GTO switches in a load circuit with inductance with low or nearly zero current flowing therein, then its anode to cathode voltage collapses instantaneously to a low value, resulting in an immediate interruption in the control current. This can lead to an unacceptable shortening of the ignition pulse.

These disadvantages can be avoided by a method according to this invention.

Said method is shown in FIG. 4. According to said method, the voltage drop $U_{AK}$ is detected at the thyristor and, whenever attaining a preset threshold value $U_{S3}$, a single ignition current pulse is released on the thyristor gate, with the magnitude and duration of this pulse being preset. In particular, each individual ignition pulse is independent of the momentary thyristor voltage in terms of its magnitude and duration, since the pulse end is no longer derived from a limit switch for the thyristor voltage. One can recognize from the ignition pulse sequence according to FIG. 5 (corresponding to FIGS. 2 and 3 for this case) that in the range $I_A > I_{A5}$ in which the thyristor voltage $U_{AK}$ is consistently above the threshold value $U_{S3}$, an ignition pulse is no longer generated. Rather, the last ignition pulse restricted in its length is released if, when raising the current load $I_A$, the lower characteristic function reaches the threshold value $U_{S3}$. The result is a significant control energy saving in case of high-load conditions. Then the threshold value $U_{S3}$ can be selected at such a low level that at a point of intersection $I_G = 0$ determined by $U_{AK} = U_{S3}$ for $I_{A6}$, the range $I_A < I_{A6}$ now encompasses practically all incompletely conducting conditions. Thus, within this range the completely conducting condition is continually reestablished by the pulse sequence shown so that the risk of destruction of the GTO by incompletely conducting conditions is substantially reduced without large energy losses arising in the high-load range. Only in the range $I_{A7} < I_A < I_{A5}$ are a few basically unnecessary ignition current pulses are generated when increasing the current load.

Figure 5:
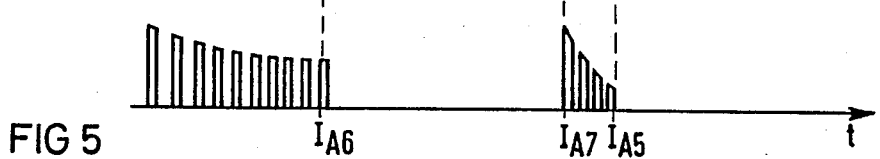
FIG. 5 is a plot similar to FIG. 3 only with a lower threshold and controlled trigger pulses.

FIG. 5 further shows that the level of the ignition current during an individual pulse and at various current loads is not constant. Rather, the magnitude of the ignition current is advantageously regulated downward during an individual pulse, particularly at the end of the pulse. This corresponds to the already mentioned fact that while to ignite the load current, a relatively high ignition current is required, but in order to maintain a conducting state, only a lower control current is required. Using this preferred further configuration of the invention then, the wave shape of a pulse is preset in accordance with the ignition or control current required in each instance.

Further energy savings are produced, if the magnitude and, if necessary, the duration of the ignition pulse are preset as a function of the gap (interval) from the preceding ignition current pulse. If the ignition current pulses occur in rapid succession, then a correspondingly lesser ignition current is required, and the magnitude of the ignition current pulse is thus correspondingly preset at the lower level.

A preferred embodiment is shown in FIGS. 6 through 9 of an apparatus to perform this method.

Figure 6:
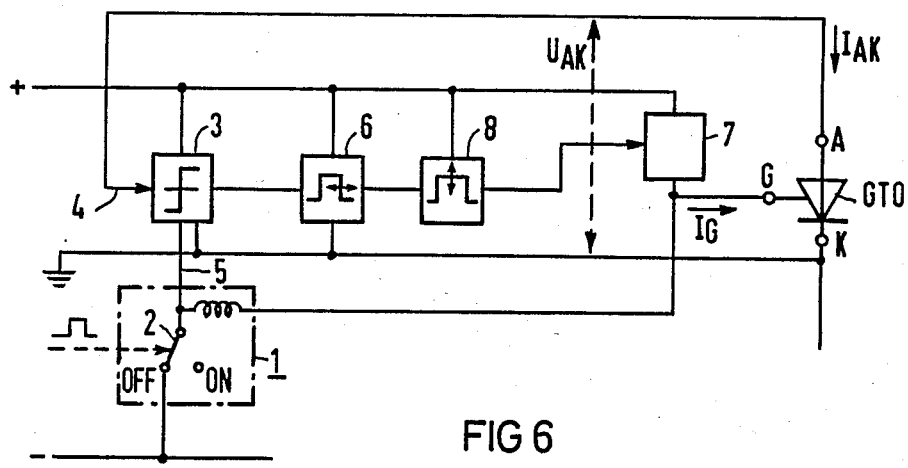
FIG. 6 is a diagrammatic functional representation of the invention.
Figure 7:
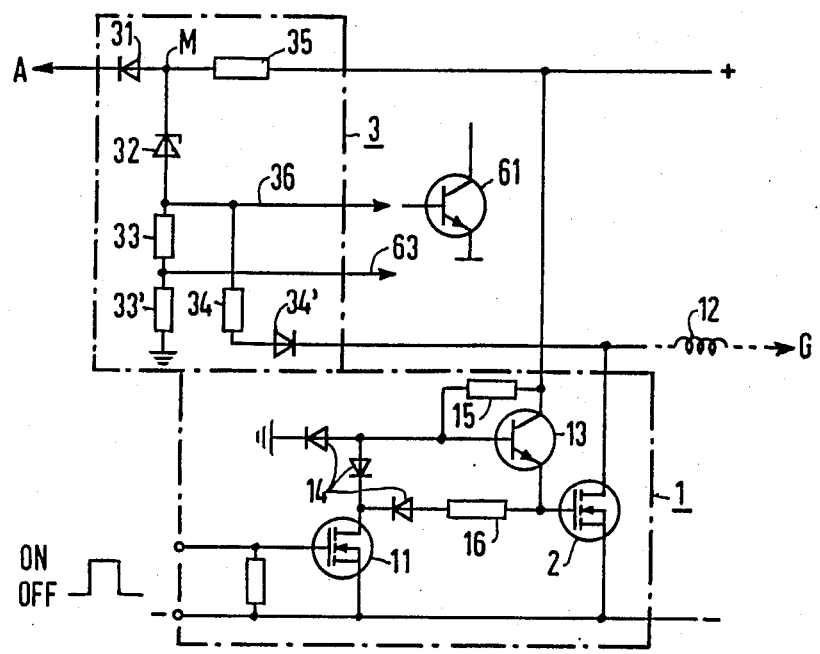
FIG. 7 is a schematic diagram showing the circuitry of comparator stage and an input stage.
Figure 8:
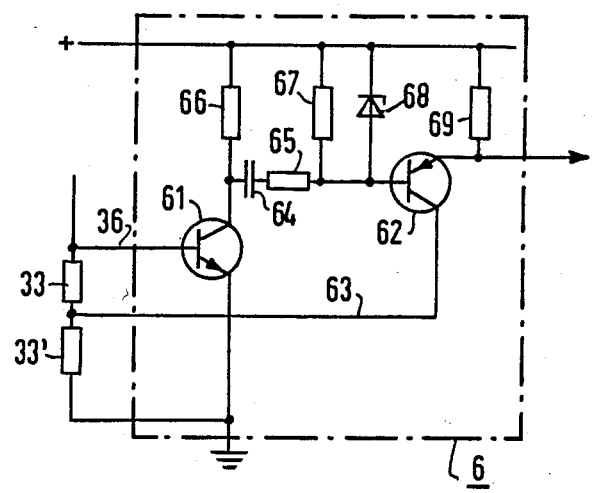
FIG. 8 is a schematic diagram showing the circuitry of a pulse duration limiting stage.
Figure 9:
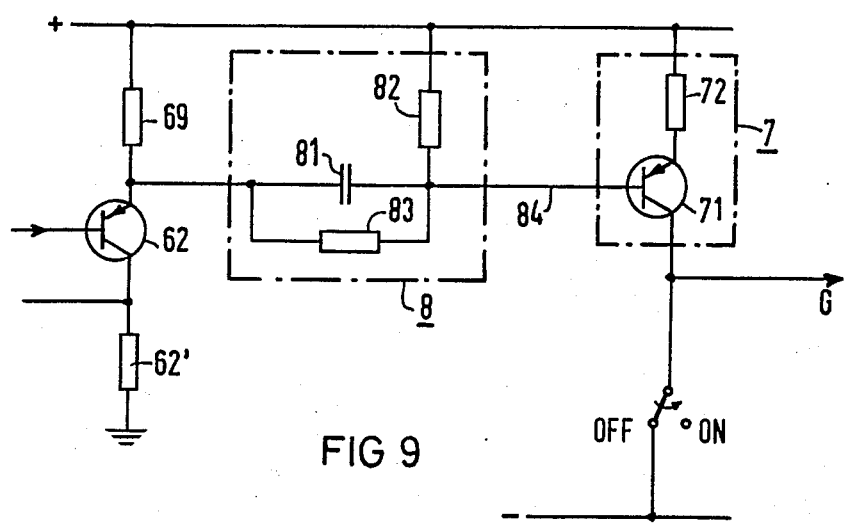
FIG. 9 is a schematic diagram showing the circuitry of a pulse magnitude limiting stage and a controlled current source stage.

FIG. 6 is a schematic depiction of the design of the apparatus. FIG. 7 shows the circuitry of the input stage and of a comparator stage. FIGS. 8 and 9 show the design of a pulse duration limiting stage or a pulse magnitude limiting stage as well as the design of a controlled current source to connect the ignition current pulse to the thyristor gate.

A, K and G are designations for the anode, cathode and gate connections of the GTO in FIG. 6. An input stage 1 receives the command to switch on and sustain the current-conducting state of the GTO by way of a switch pulse. In the schematic depiction in FIG. 6 this is shown by having a solid state switch 2 opened by means of the switch-on pulse, which in the closed state (thyristor block) switches a negative supply voltage of typically −12 V onto gate G. Simultaneously, by means of the switch-on pulse, a comparator stage 3 is activated, which on the one hand is connected to the operating voltage, typically 12 V, and to which the voltage drop $U_{AK}$ is supplied. Comparator stage 3 now issues a comparator signal as soon as the detected voltage drop of the thyristor in its conducting state exceeds a preset limit value.

The comparator signal is converted by a pulse duration limiting stage 6 to an ignition command which is limited to a preset duration independent of the comparator state. This ignition command can be longer or shorter than the state $U_{AK} > U_{S1}$.

This ignition command serves to control a controllable current source 7, which switches the ignition current pulse onto gate G for the duration defined by the ignition command. Between the pulse duration limiting stage 6 and the controlled current source 7 it is advantageous to install a pulse magnitude limiting stage 8. Stages 6, 7 and 8 are thereby similarly connected to the supply voltage, in this example +12 V.

FIG. 7 shows that in input stage 1 the control signal "Off" initially locks a field-effect transistor 11 so that transistor 13 connected by a diode circuit 14 becomes conducting and controls a further FET which serves as a switch 2. This additional FET 2 is arranged between a negative potential of, typically, −12 V, and the GTO gate G, whereby an inductance 12 can be connected to the gate connection to assist in switch-on. Through this triggering arrangement switch 2 (FIG. 6) is closed if the locked state of the GTO is to be brought about by the trigger signal "Off". Thus, the −12 V voltage is finally connected as the locking voltage, on the one hand, to the thyristor gate G and on the other also connected to the base terminal of transistor 61 (explained further below), which serves to release an ignition command and whose base terminal is connected at tap 36 of a voltage divider for the GTO voltage drop. Said transistor base-emitter junction 61 is thus rapidly reverse biased and cut off if a thyristor lock is triggered by the "Off" control signal. Resistors 15 and 16 provide control and bias currents for transistors 13 and 2.

Comparator circuit 3 contains a zener diode 32 connected by diode 31 to the anode connection A. This zener diode 32, forms on the one hand, along with resistors 33, 33', a voltage divider with tap 36, and on the other hand connects to gate terminal G by a resistor 34 and a diode 34' in the fashion shown. With the switching signal "Off" (FET 2 conducting) thus tap 36 is set for a negative potential and the comparator deactivated. With a locked GTO the voltage divider 32, 33 is positioned between the operating voltage +12 V and the lock voltage −12 V; diode 34' is conducting and the zener diode 32 breaks down. At tap 36 between zener diode 32 and resistor 33 a negative voltage prevails as the comparator signal, corresponding to a locking base terminal control of transistor 61 (to be explained below) in the pulse duration limiting stage 6.

If, conversely, switch 2 is open and a high thyristor voltage prevails at the GTO, then diode 31 is reversed biased, whose anode is connected at point M both with the voltage divider 32, 33, 33' as well as via a resistor 35 with the operating voltage (e.g., +12 V). The positive potential now prevailing at point M leads to a breakdown of the zener diode 32; at tap 36 a potential exists determined by the sizing of the elements 35, 32, 33, 33'. These elements are selected so that on the one hand a base current can flow through the transistor 61 via tap 36 and on the other so that the resulting gate/cathode voltage of the GTO occurring at these high transistor voltages $U_{AK}$ exceeds the voltage at tap 36, blocking diode 34'.

In this case (large $U_{AK}$) therefore a comparator constant signal arises which, however, is not utilized to provide a constant supply of ignition current to the thyristor gate, but only excites the subsequent pulse duration limiting stage. The comparator signal does not, however, occur when the anode voltage exceeds the potential at point M and blocks diode 31. Rather, tap 36 (and thereby the control connection for transistor 61) is already supplied with current while the anode voltage is still low enough so that diode 31 conducts, but at the same time already generates a voltage at point M which leads to the breakdown of zener diode 32. The voltage limiting value releasing the comparator signal is thus determined by the sizing of the voltage dividers 32, 33, 33'.

In this context it is particularly advantageous that a switch-on signal "On" does not immediately and necessarily lead to an ignition current pulse for the GTO over the individual stages of the device. In inverter technology, a diode is typically mounted anti-parallel to a thyristor, whereby an externally connected negative voltage drives a current. When reversing the driving voltage, one first has to wait until the current has been dissipated over the diode to such an extent that an adequately positive voltage can be formed at the thyristor connections so that a switch-on pulse will actually produce a thyristor ignition.

If, however, the ignition pulse is generated in accordance with a control sequence without considering such delay factors, then unnecessary ignition currents are generated which infringe upon the control circuitry and the power unit supplying the control circuitry. In the circuitry described herein, however, a comparator signal is only generated and an ignition pulse released if the thyristor voltage has actually attained a value adequate for successful thyristor ignition.

Tap 36 thus supplies a positive control current as a comparator signal for a downstream transistor only when on the one hand switch 2 is opened by a control signal corresponding to the switched-on GTO, and on the other hand the anode voltage attains or exceeds a limit value determined by the operating voltage, the breakdown voltage of the zener diode and the sizing of the resistors.

The pulse duration limiting stage 6 shown in FIG. 8 is similarly supplied by the positive operating voltage as opposed to cathode voltage (in this case grounded) and includes a first transistor 61, which is controlled by the comparator signal prevailing at tap 36, as well as a second transistor 62. The base terminal of the first transistor is coupled over a positive feedback line 63 to a positive feedback resistor (in the circuit shown resistor 33 is also used as the positive feedback resistor) and to a connection of the second transistor, and the base terminal of the second transistor 62 is coupled over a condenser 64 wired, in the manner specified, to resistors 65, 66, 67 and a further zener diode 68 to the first transistor. As soon as transistor 61 is activated due to a corresponding control current, a relevant transistor current from the voltage supply source flows over resistor 66 as well as the parallel branch 64, 65, 67. Thereby the load condition of condenser 64 is changed, having been initially discharged and now recharging in accordance with the time constant of its loading and discharging power unit 65, 66, 67, 68. As long as the condenser load is still low, there is only a relatively low voltage limited by the zener diode 68 at the base terminal of the second transistor 62. Thereby this transistor also is activated and brings about a current flow over its resistor circuit 69, 33', with a control current flowing to the base terminal of the first transistor 61 via the positive feedback line 63 at the same time. Thereby the first transistor 61 continues to conduct, even if the comparator signal changes and tap 36 no longer conducts any control current. The current in transistor 62, however, decreases to the extent that the load state of condenser 64 approaches exponentially its final charged state. Transistor 61 does continue to conduct thereby, at least until attaining the final voltage level at condenser 64. If, due to a continuing comparator signal, control current still prevails at voltage input 36, then transistor 61 continues to conduct current, but the second transistor 62 cuts off as soon as condenser 64 has charged up to full condenser voltage so that no more base terminal current can flow through condenser 64 to transistor 62.

Consequently the current flowing through the second transistor 62 cuts off when the condenser load attains its final state. At resistor 69 this triggering of transistor 62 produces a situation wherein whenever transistor 61 is triggered, first there is a high voltage drop which thereafter decreases in accordance with the time constant of the condenser network 64, 65, 66, 67. The duration and magnitude of this voltage signal, which can be tapped as an ignition command, is completely independent of whether the comparator signal at input 36 still prevails or disappears after releasing the ignition command.

The design of the pulse duration limiting stage 6 can be varied in several ways. Thus, for example, condenser 64 and its network can be wired parallel to transistor 61 so that with a cut off transistor at 61 it can be charged and discharged when the transistor conducts. In that case, transistor 62 is to be triggered in such a way that it blocks with loaded condenser 64; it becomes activiated when transistor 61 is switched on and remains activated until condenser 64 is fully discharged. Given the required arrangement, transistor 61 can also be controlled by such a signal at voltage tap 36 so that when it rests (i.e., as long as the comparator signal shows a thyristor voltage falling below the threshold value), it is live and only releases a voltage signal at the output of limitation stage 6 by the relevant triggering of the second transistor when passing into locked condition on attaining the threshold value.

As FIG. 9 shows, the voltage signal drawn from the resistor 69 of the limiting stage 6 is passed in the pulse magnitude limiting stage 8 over a condenser 81, which along with its resistor power network 82, 83 is characterized by a load time constant which is substantially above the time constant of the condenser power network 61, 64, 65, 66, 67, 68 limiting the ignition command duration. Thereby a control signal prevails at output 84 of this pulse magnitude limiting stage 8 which only attains the full magnitude of the ignition command signal when condenser 81 has completely discharged following the appearance of the last ignition command. Any still prevailing residual voltage in case of shorter ignition command intervals (corresponding to a d.c. voltage component in the ignition command sequence) at condenser 81, conversely, brings about a corresponding reduction of the pulse magnitude at output 84.

Thus, control output 84 supplies a signal which can be used directly to control the current from current source 7. For that purpose control input 84 is connected to the base terminal of another transistor 71 equipped with a series resistor 72 located between the operating voltage source and the gate terminal G.

Figure 10:
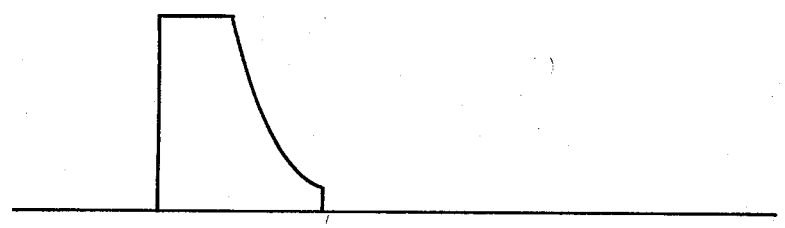
FIG. 10 is a single gate trigger pulse.

FIG. 10 shows the cycle of an individual ignition command it is generated when the pulse duration limiting stage is activated and then supplied to the pulse magnitude limiting stage. The pulse thereby rises rapidly, when a comparator signal appears, to a voltage level generated by the current load of condenser 64 and limited by the breakdown voltage of zener diode 68 (FIG. 8).

After the zener diode extinguishes, condenser 64 charges only over resistor 67 with an exponentially decreasing current. Since this current load supplies the base terminal current for transistor 62, the current through transistor 62 and resistor 69 or the control current (ignition command) flowing over the condenser network 81, 83 is also regulated downward along the same waveform until the positive feedback breaks down and trnsistor 62 is totally in cut off.

The waveform in FIG. 10 is changed if during an ignition current pulse a transition is made from an "On" signal to the "Off" signal (FIG. 7). As thereby FET2 is momentarily ignited and transistor connected to 36 cuts off as a result, the ignition current is immediately interrupted, regardless of the state of the comparator signal.

If, conversely, with an "On" signal a comparator constant signal prevails, then the ignition command is not ended by the breakdown of the positive feedback, but transistor 62 rather remains active to the extent defined by the continuously conducting transistor 61 that the current load of conductor 64 is charged exponentially until full operating voltage, which can be advantageous in certain cases.

Figure 11:
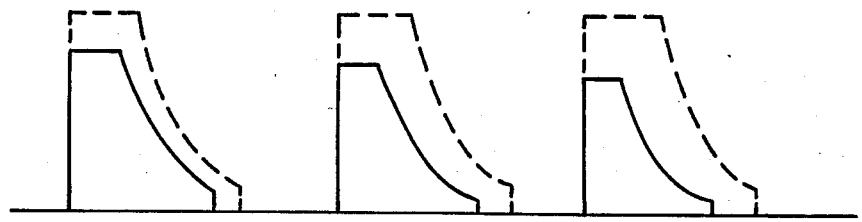
FIG. 11 is a gate trigger pulse sequence.

FIG. 11 depicts several ignition current pulses of a pulse sequence, with the broken line showing the curved pattern displayed in FIG. 10 in the event of an isolated individual pulse. In contrast to the single pulse, the pulse duration is shortened by the fact that condenser 64 cannot fully discharge between two ignition commands via its resistive voltage network 65, 66, 67.

On the other hand, with each ignition command condenser 81 of the pulse magnitude limitation stage is charged up and can similarly discharge only to the extent permitted by the "OFF" periods. Thereby, a d.c. voltage component is generated in condenser 81 which, while not substantially affecting the formation of the ignition commands, reduces the control voltage for the control transistor 71 of the controllable current source 7, thereby also regulating downwards the level of the ignition current pulses, again depending upon the "OFF" periods.

This wave shape and its adjustment to the frequency of the pulses closely approximate the preset requirements for the ignition current for a quasi-continuous power supply.

In this type of circuit—even if the GTO switches to a de-energized load inductance—the initially mentioned difficulties would not arise since level, pattern and extent of the ignition pulse are preset by the circuit. For the ignition energy requirement one can see from FIG. 5 that in the range $I_A > I_{A5}$ no ignition current is generated so that the energy requirement here is very slight. In the narrow range $I_{A5} > I_A > I_{7A}$ basically unnecessary ignition currents are generated which can, however, be avoided by a current-load dependent ignition pulse block if it still makes economic sense to go to the expense of designing the circuitry for that purpose given this very narrow range. The ignition current pulse sequences arising for low current conditions, $I_A < I_{A6}$, are largely optimized in terms of the pulse magnitude and duration. In a switching cycle approximating actual conditions, the energy requirement is thus only approximately 25% of the energy requirement of a triggering system with constant ignition current. As the cost of the circuitry is higher than in the constant ignition current triggering arrangement, but as significant energy savings arise primarily in the event of high loads, this circuitry is particularly advantageous for converter units with high capacities and similar applications in which the system must operate under high loads over extended periods and a high control energy requirement of the GTO employed drive up the expense required for its triggering circuits.

For a comparison with the pulse sequence in FIG. 2, similar relationships ensue if the special value $U_{S1}$ is selected at a similarly low level. A high threshold value $U_{S2}$ with pulse sequences in accordance with FIG. 3 can often not be realized anyway due to the increased risk of a GTO breakdown given incompletely conducting thyristor conditions. Avoiding unnecessary ignition current pulses ($I_A > I_{A5}$ range) as well as the reduction of pulse magnitudes in a pulse sequence are also advantageous from the perspective that the generation of pulse sequences represents a basically unpleasantly pulsating load on the operating voltage supply for the triggering circuits.

As will be evident from the foregoing description, certain aspects of the invention are not limited to the particular details of the examples illustrated, and it is therefore contemplated that other modifications or applications will occur to those skilled in the art. It is accordingly intended that the claims shall cover all such modifications and applications as do not depart from the true spirit and script of the invention.

What is claimed as new and desired to be secured by Letters Patent of the United States is:

1. A method for triggering and maintaining a current-conducting state of a gate-turn-off thyristor, comprising the steps of:
    detecting a voltage drop between the anode and cathode of a gate-turn-off thyristor; then
    initiating an ignition current pulse of pre-determined magnitude to the gate of the gate-turn-off thyristor whenever a preset threshold voltage is attained by said detected voltage drop; then
    terminating the ignition current pulse after a pre-determined time, that pre-determined time being independent of the further continuation of said detected voltage drop after the initiation of said ignition current pulse,
    said ignition current pulse magnitude and duration being pre-determined as a function of a time period since a previous ignition current pulse.

2. A method according to claim 1, wherein said ignition current pulse magnitude, particularly the magnitude at the end of said ignition current pulse, is reduced.

3. An apparatus for triggering and maintaining the current conducting state of a gate-turn-off thyristor, comprising:
    a comparator stage having an input connected to an electrode of a gate-turn-off thyristor issuing a comparator output signal whenever a detected voltage drop across the gate-turn-off thyristor exceeds a preset limit value;
    a pulse duration determining stage connected to said comparator stage and generating an ignition command of a pre-determined duration resulting from said comparator output signal, said duration being independent of the further continuation of the detected voltage drop after the generation of said ignition command;
    a pulse magnitude limiting stage charged by said ignition command of said pulse duration determining stage, and pre-determining the magnitude of said ignition current pulse as a function of a time period since a previous ignition current pulse, and
    a current source, charged by said pulse magnitude limiting stage, and issuing an ignition current pulse to the gate-turn-off thyristor gate.

4. An apparatus according to claim 3, wherein said comparator stage includes:
    a voltage divider of a resistance network and a zener diode connected to the thyristor voltage, a tap of said voltage divider being connected to said pulse duration determining stage for providing, upon the attaining of a threshold voltage that causes voltage breakdown of said zener diode, a signal to charge a condenser within said pulse duration determining state.

5. An apparatus according to claim 3, further comprising:
    a control input stage having a solid state switch;
    a voltage divider connected within said comparator stage and dividing the voltage drop of the thyristor, and
    a first transistor in said pulse duration determining stage connected to said comparator stage, wherein said switch, upon receiving a disengage signal, connects a blocking voltage to the gate of the thyristor and to the base terminal of said first transistor.

6. An apparatus according to claim 3: said pulse duration determining stage including
    first and second transistors connected to a voltage supply, said first transistor being controlled by said comparator output signal connected to its base terminal;
    a positive feedback coupling connecting said first transistor base terminal with said second transistor, and
    a first condenser network coupling the base terminal of said second transistor to said first transistor, whereby a triggered state of said first transistor induced by said comparator signal provides on one hand a condenser voltage change in said first condenser network up to a final voltage value preset by said network, whereby the condenser voltage change triggers said second transistor to generate an ignition command, and, on the other hand, said first transistor, as a result of the triggered state of said second transistor brought about by the condenser voltage change, is maintained in the state triggered by the comparator signal at least until attaining the final voltage value.

7. An apparatus according to claim 3, further comprising:
said pulse magnitude limiting stage including a second condenser network connected therein,
said second condenser network being charged by said ignition command, thereby changing a condenser voltage during a time period between two said ignition pulses according to a time constant preset by said second condenser network, which time constant falls above said preset pulse duration of said pulse duration determining stage, and
said current source being connected to said second condenser network, the current magnitude of said ignition current pulses being controlled by said second condenser voltage during an ignition command.

* * * * *